United States Patent
Haringer et al.

(10) Patent No.: US 10,968,533 B2
(45) Date of Patent: Apr. 6, 2021

(54) FEED SYSTEM FOR CRYSTAL PULLING SYSTEMS

(71) Applicant: SunEdison, Inc., Maryland Heights, MO (US)

(72) Inventors: Stephan Haringer, Castelbello/Ciardes (IT); Gianni Dell'Amico, Merano (IT); Giancarlo Zago, Merano (IT); Renzo Odorizzi, Gargazone (IT); Giorgio Agostini, San Giacomo di Laives (IT); Marco Zardoni, Merano (IT)

(73) Assignee: Corner Star Limited, Kowloon (HK)

( * ) Notice: Subject to any disclaimer, the term of this patent is extended or adjusted under 35 U.S.C. 154(b) by 133 days.

(21) Appl. No.: 15/053,870

(22) Filed: Feb. 25, 2016

(65) Prior Publication Data

US 2017/0247809 A1    Aug. 31, 2017

(51) Int. Cl.

| C30B 15/04 | (2006.01) |
| C30B 15/02 | (2006.01) |
| C30B 15/00 | (2006.01) |
| C30B 15/12 | (2006.01) |
| C30B 15/14 | (2006.01) |
| C30B 15/20 | (2006.01) |
| C30B 29/06 | (2006.01) |

(52) U.S. Cl.
CPC ............ *C30B 15/04* (2013.01); *C30B 15/002* (2013.01); *C30B 15/02* (2013.01); *C30B 15/12* (2013.01); *C30B 15/14* (2013.01); *C30B 15/20* (2013.01); *C30B 29/06* (2013.01)

(58) Field of Classification Search
CPC ....... C30B 15/002; C30B 15/02; C30B 15/04; C30B 15/12; C30B 15/14; C30B 15/20; C30B 29/06
See application file for complete search history.

(56) References Cited

U.S. PATENT DOCUMENTS

| 4,002,274 A | * | 1/1977 | Rice ................... B65G 65/4818 |
| | | | 222/410 |
| 5,492,078 A | | 2/1996 | Alterkruger et al. |
| | | (Continued) | |

FOREIGN PATENT DOCUMENTS

| CN | 104947186 A | 9/2015 |
| EP | 1338682 A2 | 8/2003 |
| | (Continued) | |

OTHER PUBLICATIONS

Invitation to Pay Additional Fees regarding PCT/US2017/019260 dated May 31, 2017; pp. 1-12.

*Primary Examiner* — Hua Qi
(74) *Attorney, Agent, or Firm* — Armstrong Teasdale LLP

(57) ABSTRACT

A system for growing silicon crystal structures includes a housing defining a growth chamber and a feed system connected to the housing for delivering silicon particles to the growth chamber. The feed system includes a container for holding the silicon particles. The container includes an outlet for discharging the silicon particles. The feed system also includes a channel connected to the outlet such that silicon particles discharged from the container flow through the channel. The feed system further includes a separation valve connected to the channel and to the housing. The separation valve is configured such that a portion of the feed system rotates relative to the housing.

5 Claims, 4 Drawing Sheets

(56) References Cited

U.S. PATENT DOCUMENTS

| | | | |
|---|---|---|---|
| 5,587,016 A | 12/1996 | Altekruger et al. | |
| 5,762,491 A * | 6/1998 | Williams | C30B 15/02 |
| | | | 110/101 R |
| 5,858,087 A * | 1/1999 | Taguchi | C30B 15/02 |
| | | | 117/213 |
| 5,868,835 A | 2/1999 | Nagai et al. | |
| 5,902,395 A | 5/1999 | Nagai et al. | |
| 7,052,547 B2 | 5/2006 | Watanabe et al. | |
| 8,021,483 B2 | 9/2011 | Arvidson et al. | |
| 2012/0199221 A1 * | 8/2012 | Nakamura | C30B 15/002 |
| | | | 137/561 A |
| 2013/0098290 A1 * | 4/2013 | Luter | C30B 15/002 |
| | | | 117/214 |

FOREIGN PATENT DOCUMENTS

| | | | | |
|---|---|---|---|---|
| JP | 323286 A | 1/1991 | | |
| WO | WO 2014195980 A1 * | 12/2014 | | C30B 15/02 |
| WO | WO-2014195980 A1 * | 12/2014 | | C30B 15/20 |

* cited by examiner

FEED SYSTEM FOR CRYSTAL PULLING SYSTEMS

FIELD

This disclosure generally relates to systems and methods for the production of ingots of semiconductor or solar-grade material and more particularly to systems and methods including feed systems for delivering semiconductor or solar-grade feedstock material to a crystal pulling system.

BACKGROUND

In the production of single silicon crystals grown by the Czochralski (CZ) method, polycrystalline silicon is delivered into and melted within a crucible, such as a quartz crucible, to form a silicon melt. A puller lowers a seed crystal into the melt and slowly raises the seed crystal out of the melt, solidifying the melt onto the seed crystal. In the continuous Czochralski method, a continuous flow of polycrystalline silicon is delivered into the crucible to maintain the silicon melt at a substantially constant level. The flow of polycrystalline silicon particles into the crucible must be precisely controlled to control the purity and quality of the formed single silicon crystals. A housing encloses the crucible and defines a growth chamber.

At least some known systems for forming single silicon crystals include a feed system attached to the housing for delivering the polycrystalline silicon particles to the crucible. However, the polycrystalline silicon particles may be contaminated by the feed systems as the particles are delivered to the crucible. Moreover, the feed systems may not deliver the polycrystalline silicon particles to the crucible at a flow rate sufficient to match the continuous extraction of melted silicon.

In some crystal growing systems, the feed systems must be detached from the housing for maintenance and loading of the feed systems and/or for maintenance of the crucible. However, detaching the feed systems reduces the productivity of the systems. For example, detaching or reattaching the feed systems may cause vibrations that disturb the formation of the single silicon crystals. Therefore, at least some crystal growing systems are shut down while the feed systems are detached and reattached. Also, complicated engineering and several hours of labor may be required to disassemble and reassemble the feed systems due to the weight and size of the feed systems.

Thus, there exists a need for a more efficient and effective system to deliver a precise and continuous flow of polycrystalline silicon particles to a crucible.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for growing silicon crystal structures is provided. The system includes a housing defining a growth chamber, and a feed system connected to the housing for delivering silicon particles to the growth chamber. The feed system includes a container for holding the silicon particles. The container includes an outlet for discharging the silicon particles. The feed system also includes a channel connected to the outlet such that silicon particles discharged from the container flow through the channel. The feed system further includes a separation valve connected to the channel and to the housing. The separation valve is configured such that a portion of the feed system rotates relative to the housing.

In another aspect, a feed system for delivering silicon particles to a crystal pulling system is provided. The system includes a separation valve for connecting the feed system to a housing of the crystal pulling system such that the silicon particles are delivered to a growth chamber defined by the housing. The system further includes a frame for maintaining the feed system in fixed alignment with the growth chamber. The frame is connected to the housing such that the housing can be opened to provide access to the growth chamber.

In yet another aspect, a system for growing silicon crystal structures is provided. The system includes a housing defining a growth chamber, and a feed system connected to the housing and configured for delivering silicon particles to the growth chamber. The feed system includes a container for holding the silicon particles. The container includes an outlet for discharging the silicon particles, and an outlet extension configured such that a layer of silicon particles collects adjacent the outlet extension. The feed system further includes a channel for silicon particles discharged from the container to flow through, and a liner. The channel has an interior surface, and the liner is adjacent the interior surface of the channel to inhibit the silicon particles contacting the interior surface. At least one barrier is disposed in the channel to slow the flow of silicon particles through the channel.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
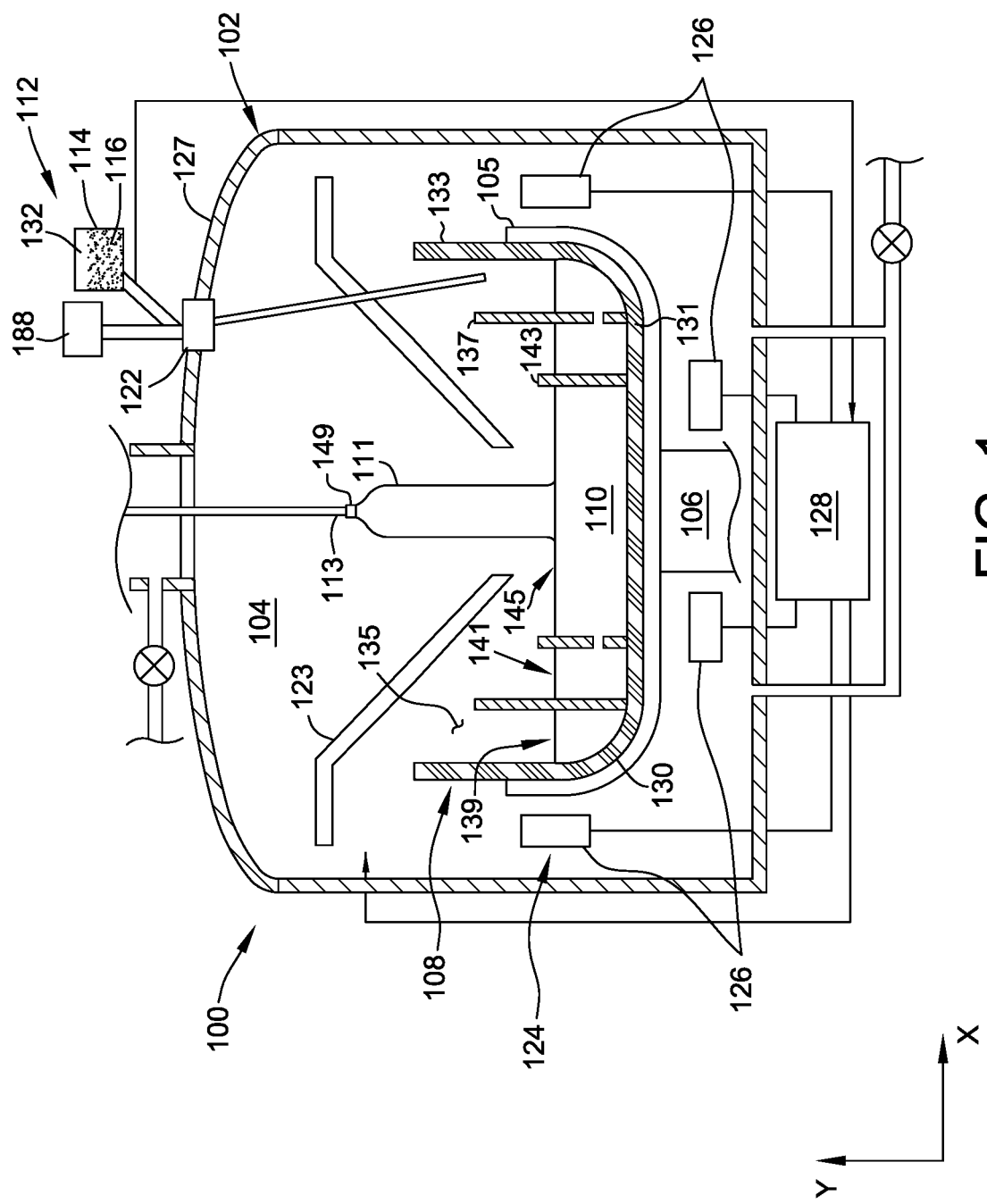
FIG. 1 is a schematic illustration of a crystal pulling system.
Figure 2:
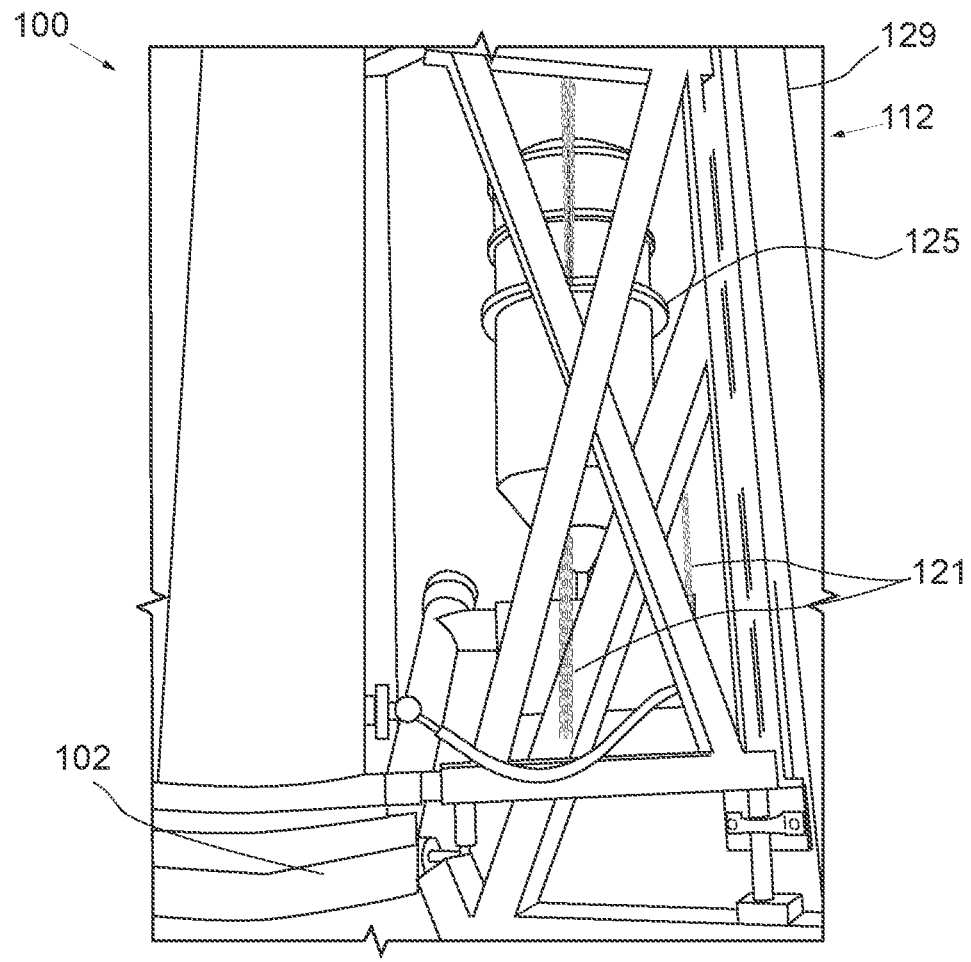
FIG. 2 is a front view of the crystal pulling system shown in FIG. 1.

Referring to FIG. 1, a crystal pulling system is shown schematically and is indicated generally at 100. FIG. 1 shows an X-axis and a Y-axis for reference during the following description. Unless otherwise noted, directions refer to the orientation of crystal pulling system 100 shown in FIG. 1. Crystal pulling system 100 may be used to produce a single crystal ingot by a Czochralski method.

While the system is described in relation to the continuous Czochralski method of producing single crystal ingots, a batch process may be used.

The illustrated crystal pulling system 100 includes a housing 102 defining a growth chamber 104, a susceptor 105 supported by a rotatable shaft 106, a crucible assembly 108 that contains a melt 110 of semiconductor or solar grade material (e.g., silicon) from which an ingot 111 is being pulled by a crystal puller 113, and a heating system 124 for supplying thermal energy to system 100. The illustrated system 100 also includes a heat shield 123 configured to shield ingot 111 from radiant heat from melt 110 to allow ingot 111 to solidify.

Housing 102 encloses susceptor 105, crucible assembly 108, and portions of heating system 124. Housing 102 includes an upper dome 127, which may include one or more view ports to enable an operator to monitor the growth process. In use, housing 102 may be used to seal growth chamber 104 from the external environment. Suitable materials from which housing 102 may be constructed include, but are not limited to, stainless steel.

Crucible assembly 108 includes a crucible 130 having a base 131 and a generally annular sidewall 133 extending around the circumference of base 131. Together, base 131 and sidewall 133 define a cavity 135 of crucible 130 within which melt 110 is disposed. Crucible 130 may be constructed of any suitable material that enables system 100 to function as described herein including, for example, quartz.

Crucible assembly 108 also includes a plurality of weirs or fluid barriers that separate melt 110 into different melt zones. In the illustrated embodiment, crucible assembly 108 includes a first weir 137 (broadly, a fluid barrier) separating an outer melt zone 139 of melt 110 from an inner melt zone 141 of melt 110, and a second weir 143 (broadly, a fluid barrier) at least partially defining a growth zone 145 from which crystal ingot 111 is pulled. First weir 137 and second weir 143 each have a generally annular shape, and have at least one opening defined therein to permit melt 110 to flow radially inward towards growth zone 145. First weir 137 and second weir 143 are disposed within cavity 135 of crucible 130, and create a circuitous path from outer melt zone 139 to inner melt zone 141 and growth zone 145. Weirs 137, 143 thereby facilitate melting solid feedstock material 116 before it reaches an area immediately adjacent to the growing crystal (e.g., growth zone 145). Weirs 137, 143 may be constructed from any suitable material that enables system 100 to function as described herein, including, for example, quartz. While the illustrated embodiment is shown and described as including two weirs, system 100 may include any suitable number of weirs that enables system 100 to function as described herein, such as one weir, three weirs, or four or more weirs.

Crucible 130, first weir 137, and second weir 143 may be formed separately from one another, and assembled to form crucible assembly 108. In other suitable embodiments, crucible assembly 108 may have a unitary construction. That is, crucible 130 and one or both weirs 137, 143 may be integrally formed (e.g., formed from a unitary piece of quartz).

Crystal pulling system 100 further includes a feed system 112. As will be described in more detail below, feed system 112 includes a container 114 for holding feedstock material 116 and is configured to provide feedstock material 116 to crucible 130. Feed system 112 is fixedly mounted to housing 102. Specifically, in the illustrated embodiment, feed system 112 is connected to upper dome 127. At least a portion of feed system 112, such as container 114, is maintained in a substantially fixed position relative to housing 102. As a result, during setup and maintenance of crystal pulling system 100, feed system 112 remains mounted on housing 102, which simplifies operation of crystal pulling system 100. Moreover, feed system 112 can be refilled during operation of crystal pulling system 100 without disturbing the formation of single crystal ingot 111.

Feed system 112 is supported in fixed alignment with growth chamber 104 by support mechanisms including a mount 119, a plurality of chains 121, and a collar 125. Mount 119, chains 121, and collar 125 are connected to a frame 129. Accordingly, mount 119, chains 121, collar 125, and frame 129 maintain feed system 112 in a fixed position during operation of crystal pulling system 100. In alternative embodiments, feed system 112 is mounted to any portions of crystal pulling system 100 in any manner that enables crystal pulling system 100 to operate as described. In some embodiments, at least a portion of feed system 112 is movable in relation to crucible 130 to facilitate operation and maintenance of crystal pulling system 100.

Feed system 112, and in particular container 114, may be sized to hold at least the amount of feedstock material 116 required for a complete growing cycle of single crystal ingot 111. As a result, the risk of contamination and growth failure are reduced. For example, operators are not required to provide additional feedstock material 116, which may introduce contaminants, to feed system 112 during the growing cycle. Moreover, crystal pulling system 100 reduces the risk of operator exposure to hazardous materials.

During operation of crystal pulling system 100, feed system 112 supplies feedstock material 116 to crucible 130, which is melted to form melt 110. Heating system 124 includes a plurality of heaters 126 positioned adjacent crucible 130 to provide heat for liquefying or melting feedstock material 116 to form melt 110. A seed crystal 149 is lowered into and then slowly raised out of melt 110 to grow single crystal ingot 111. As seed crystal 149 is slowly raised, silicon atoms from melt 110 align with and attach to the silicon atoms of ingot 111 allowing single crystal ingot 111 to grow larger and larger. The raising of the silicon atoms from melt 110 causes them to cool and solidify.

A controller 128 controls feed system 112 and heating system 124 to maintain silicon melt 110 at a desired state for forming single crystal ingot 111. Controller 128 is capable of supplying feedstock material 116 while ingot 111 is raised from melt 110. For example, controller 128 may control the addition of feedstock material 116 based at least in part on the mass of the silicon in crucible 130, e.g., by measuring the weight or measuring liquid height of melt 110. In addition, the amount of current supplied to each of heater 126 by controller 128 may be separately and independently chosen to optimize the thermal characteristics of melt 110. Controller 128 sends signals to and/or receives signals from any components of system 100. For example, in the illustrated embodiment, controller 128 is coupled to and communicates with at least heating system 124, separation valve 122, and feed system 112.

As discussed above, during operation of system 100, puller 113 moves seed crystal 149 toward and away from melt 110 in a direction perpendicular to the surface of melt 110 such that seed crystal 149 is lowered into melt 110 and then raised out of melt 110. As seed crystal 149 is raised out of melt 110, single crystal ingot 111 is formed. Characteristics of melt 110 such as temperature, pressure, and purity are maintained at a predetermined level to produce a high quality single crystal ingot 111. For example, the introduction of foreign solid particles into melt 110 must be minimized. Moreover, the purity of melt 110 is determined at least in part by the purity of feedstock material 116 provided by feed system 112.

Figure 3:
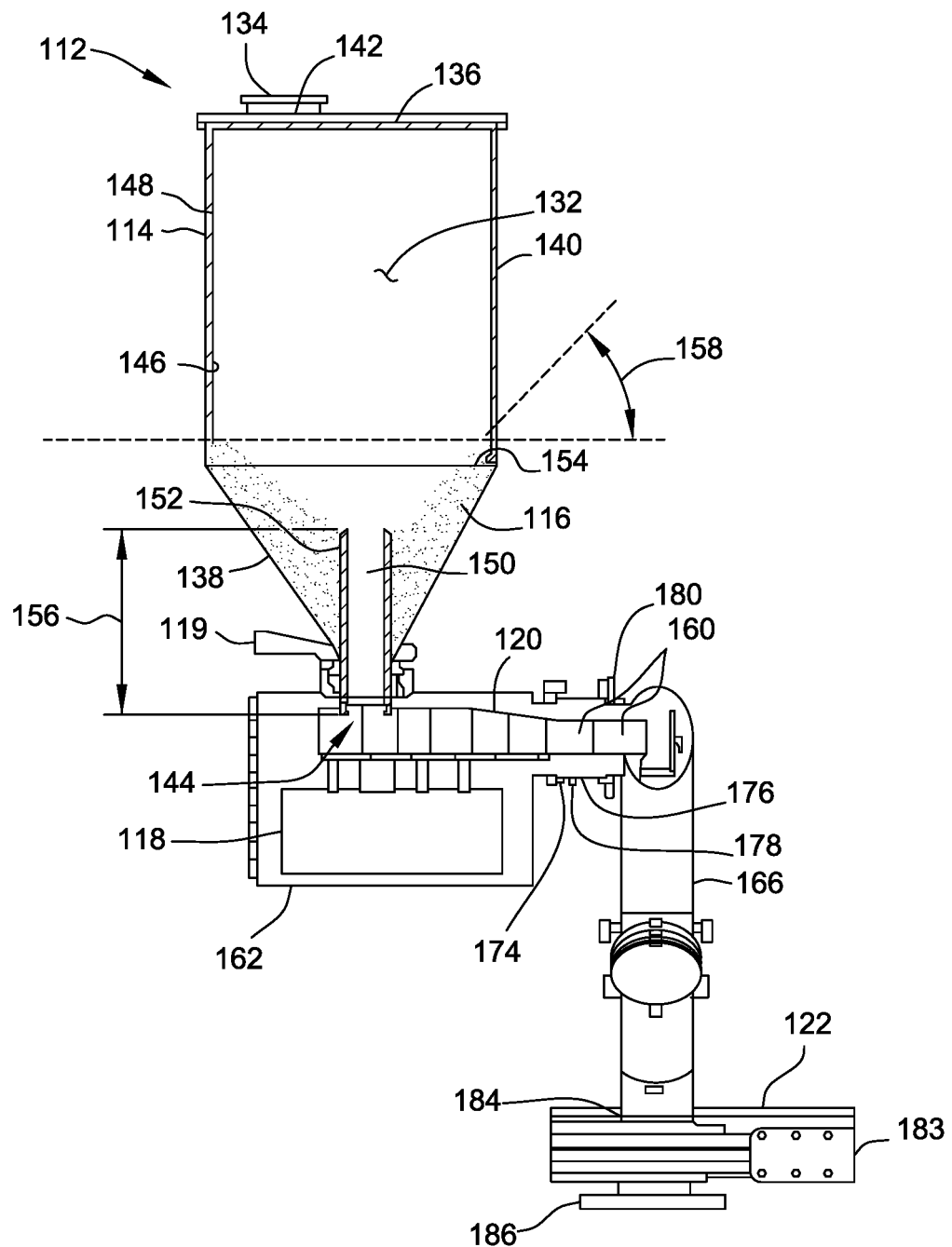
FIG. 3 is a front sectional view of a feed system for use in the crystal pulling system shown in FIG. 1.
Figure 4:
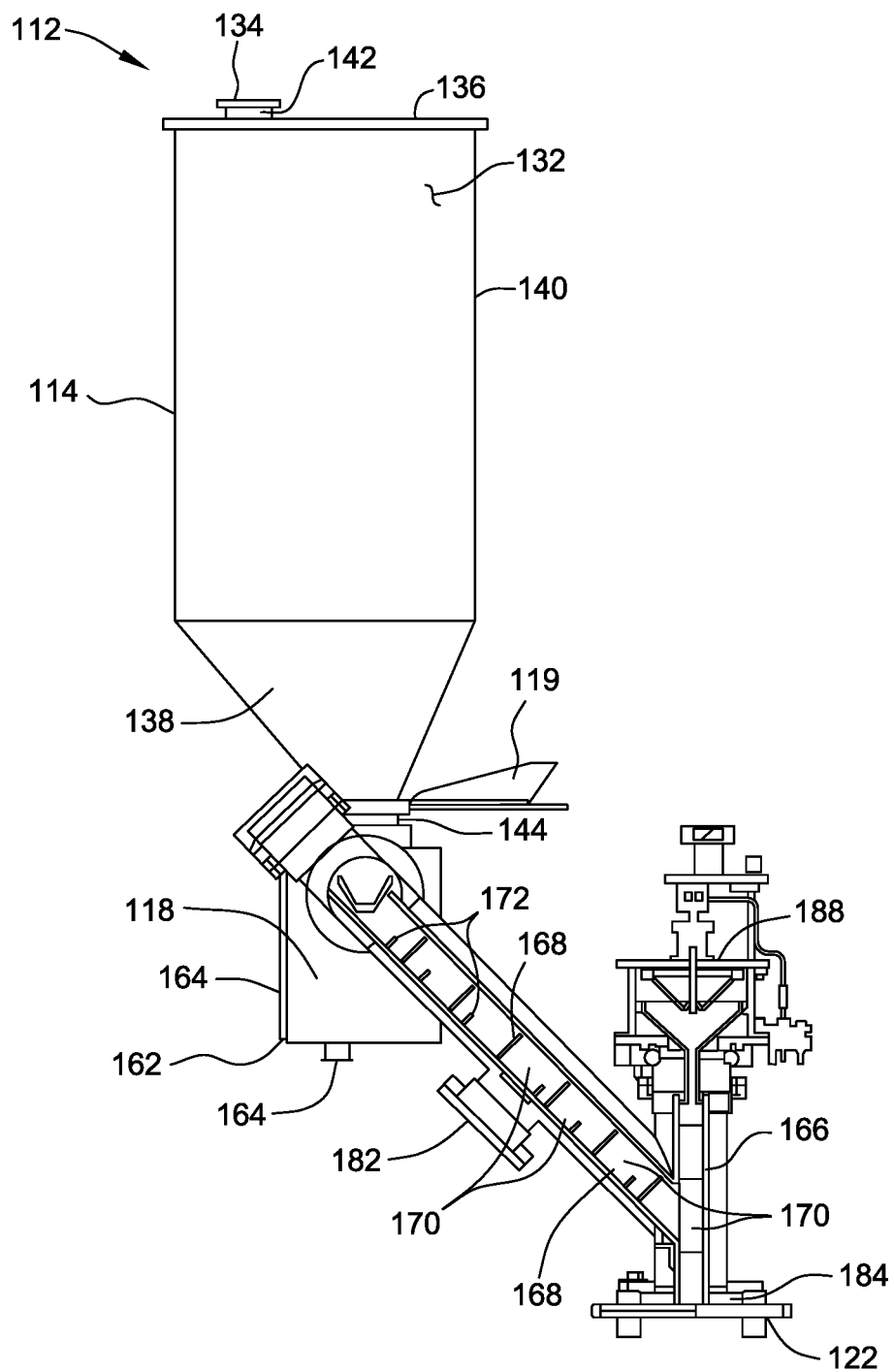
FIG. 4 is a side sectional view of the feed system shown in FIG. 3.

In reference now to FIGS. 3 and 4, feed system 112 includes container 114 defining an interior space 132 for holding feedstock material 116. Container 114 may be constructed of any suitable materials. In the illustrated embodiment, container 114 is made of aluminum and is anodized to provide resistance to corrosion. In alternative embodiments, container 114 is made of a material similar to feedstock material 116 to inhibit contamination of feedstock material 116. For example, in some embodiments, container 114 is made of quartz and/or silicon.

Container 114 includes a top wall 136, a bottom wall 138 opposite top wall 136, and a sidewall 140 extending between top wall 136 and bottom wall 138. Top wall 136 defines an inlet 142 for material to enter interior space 132. Bottom wall 138 defines an outlet 144 for material to exit interior space 132. Container 114 further defines an interior surface 146. In particular, interior surface 146 is defined by the portions of top wall 136, bottom wall 138, and sidewall 140 facing interior space 132.

Top wall 136, bottom wall 138, and sidewall 140 of container 114 may have any suitable shape. In the illustrated embodiment, sidewall 140 is substantially cylindrical and is closed at opposed ends by top wall 136 and bottom wall 138. Top wall 136 is substantially flat and circular. Bottom wall 138 is partially angled and forms a conical shape. Accordingly, bottom wall 138 facilitates feedstock material 116 flowing through outlet 144. Moreover, positioning outlet 144 in bottom wall 138 facilitates feedstock material 116 flowing through container 114 due to gravity. In alternative embodiments, container 114 has any walls suitable for feed system 112 to operate as described.

A refill flange 134 is coupled to container 114 adjacent inlet 142 to facilitate providing feedstock material 116 to interior space 132 of container 114. Feedstock material 116 may be any material suitable for forming melt 110. For example, in some embodiments, feedstock material 116 includes polycrystalline silicon particles.

Feed system 112 further includes a liner 148 adjacent interior surface 146 to inhibit feedstock material 116 contacting interior surface 146. In particular, liner 148 extends adjacent the cylindrical portion of sidewall 140. In some embodiments, liner 148 may extend adjacent top wall 136 and bottom wall 138. Liner 148 inhibits container 114 from contacting and/or contaminating feedstock material 116. As a result, container 114 can be made of less expensive materials without increasing the risk of contaminating feedstock material 116. Liner 148 may be any material suitable to inhibit contamination of feedstock material 116. For example, in some embodiments, liner 148 is made of quartz and/or silicon. Additionally or alternatively, liner 148 includes a plurality of tiles, such as silicon tiles, that cover portions of container 114. In further embodiments, liner 148 is a coating applied to interior surface 146. Liner 148 may have any thickness that enables crystal pulling system 100 to operate as described.

In the illustrated embodiment, an outlet extension 150 extends adjacent outlet 144. Outlet extension 150 is configured to facilitate feedstock material 116 forming a stagnant layer 154. Stagnant layer 154 reduces the dust and powder flowing through crystal pulling system 100. In some embodiments, at least some dust and powder collects in stagnant layer 154. Moreover, stagnant layer 154 reduces the abrasion and wearing of bottom wall 138 and the risk of contamination due to flowing feedstock material 116 contacting bottom wall 138. As such, bottom wall 138 can be made of a less expensive material and feed system 112 requires less maintenance.

In the illustrated embodiment, outlet extension 150 includes a stand pipe 152 extending from outlet 144 such that feedstock material 116 collects around stand pipe 152 and forms stagnant layer 154 adjacent bottom wall 138. Stagnant layer 154 inhibits flowing feedstock material 116 contacting bottom wall 138 as feedstock material 116 is directed towards outlet 144. In alternative embodiments, outlet extension 150 includes an inverted cone that directs feedstock material 116 into outlet 144 and facilitates feedstock material 116 collecting around outlet 144. Outlet extension 150 may be any suitable material and have any suitable thickness. In some embodiments, outlet extension 150 is constructed of quartz.

Outlet extension 150 has a height 156 configured such that feedstock material 116 collects around outlet extension 150 to form stagnant layer 154 substantially covering bottom wall 138. For example, in the illustrated embodiment, height 156 of stand pipe 152 is configured such that stagnant layer 154 has a surface angle 158 relative to the horizontal that is less than the angle of repose of feedstock material 116. As used throughout this description, the term "angle of repose" refers to the greatest angle relative to the horizontal plane at which material lies without slumping. In the illustrated embodiment, stagnant layer 154 forms a funnel shape to direct feedstock material 116 into outlet 144 through outlet extension 150.

Feedstock material 116 flows through outlet 144 and is provided to a transport mechanism 118 where the material is directed through a conduit 120. Transport mechanism 118 may be any mechanism configured to transport feedstock material 116 through conduit 120. Flow of feedstock material 116 through conduit 120 can be controlled by transport mechanism 118. Suitably, the interior surfaces of transport mechanism 118 and/or conduit 120 are covered with a liner to inhibit material contacting the interior surfaces. For example, in the illustrated embodiment, a plurality of tiles 160 are adjacent the interior surface of conduit 120. Tiles 160 may be constructed of any materials that inhibit contamination of silicon particles. For example, tiles 160 may be any of the following, without limitation: quartz, silicon, and/or any other materials suitable to inhibit contamination of silicon particles.

In the example embodiment, transport mechanism 118 vibrates to induce feedstock material 116 to flow through feed system 112. In alternative embodiments, transport mechanism 118 has any configuration that enables crystal pulling system 100 to operate as described. In the illustrated embodiment, transport mechanism 118 is separated from container 114 and other portions of feed system 112 such that vibrations are not transmitted throughout the entirety of feed system 112. As such, the generation of dust and powder in feed system 112 is reduced. In addition, the wearing due to vibrations of components of feed system 112, such as container 114, is reduced.

A housing 162 encloses transport mechanism 118 and conduit 120. Housing 162 is airtight such that a vacuum force can be applied to transport mechanism 118 and/or conduit 120 within housing 162. Housing 162 includes access panels 164 that provide access to transport mechanism 118 and/or conduit 120 for inspection and maintenance. Suitably, access panels 164 include at least one of the following, without limitation: a flange, a door, and/or a removable panel. One access panel 164 is disposed on a side of housing 162 and one access panel 164 is disposed on the bottom of housing 162. In some embodiments, a vacuum source and/or a gas supply can be removably connected to at least one of access panels 164. For example, access panel 164 on the bottom of housing 162 includes a flange for connecting to a vacuum source and/or a gas supply. Accordingly, access panel 164 enables multiple purging cycles to be performed after feed system 112 is refilled. In alternative embodiments, housing 162 has any configuration that enables feed system 112 to operate as described. In some embodiments, access panels 164 include a viewport to enable operators to view operation of feed system 112 without opening or dismounting feed system 112.

A channel structure 166 includes a channel 168 and is coupled to housing 162 such that material flows from conduit 120 into channel 168. The interior surface of channel 168 is covered by a plurality of tiles 170 to inhibit feedstock material 116 contacting the interior surface of channel structure 166 as feedstock material 116 flows through channel 168. In particular, substantially the entire interior surface of channel 168 is covered by tiles 170. In suitable embodiments, tiles 170 may be any suitable material. In the illustrated embodiment, tiles 170 are constructed of a silicon material to inhibit contamination from feedstock material 116 contacting and abrading tiles 170.

Tiles 170 may be connected to channel 168 in any suitable manner. For example, in the illustrated embodiment, an adhesive connects tiles 170 to channel 168. The adhesive is compatible with the materials of tiles 170 and channel 168 and is configured to withstand vibrations during operation of crystal pulling system 100. One example of a suitable adhesive is an epoxy amine two-component adhesive. In alternative embodiments, mechanical fasteners, welds, and any other suitable connection means may be used to connect tiles 170 to channel 168. Tiles 170 may have any suitable size. In some embodiments, tiles 170 have a thickness in a range between about 1 millimeter (mm) and about 20 mm or between about 2 mm and about 10 mm. In the example embodiment, tiles 170 have a thickness of approximately 5 mm.

Suitably, channel 168 is sloped to facilitate feedstock material 116 flowing through channel 168 in a direction away from container 114 and towards crucible 130. In the illustrated embodiment, feedstock material 116 flows through channel 168 in a generally downward direction. To control the flow rate of material through channel 168, a plurality of barriers 172 are disposed in channel 168. Barriers 172 define a surface that extends into the flow path of feedstock material 116. Accordingly, feedstock material 116 flowing through channel 168 strikes the surface of barriers 172 and is disrupted and/or slowed. As a result, barriers 172 allow the flow of feedstock material 116 to be controlled. For example, barriers 172 reduce the flow rate of feedstock material 116 and, thereby, reduce the deterioration of feed system 112 due to feedstock material 116 flowing through channel 168.

Barriers 172 may have any suitable configuration. In the illustrated embodiment, barriers 172 are substantially plate shaped projections that extend from the bottom of channel 168 in a direction perpendicular to the direction of flow. Accordingly, in the illustrated embodiment, barriers 172 are substantially parallel to each other. Any suitable number of barriers 172, including one, may be disposed in channel 168. In the illustrated embodiment, seven of barriers 172 are disposed in channel 168. In further embodiments, barriers 172 may be omitted. The configuration of barriers 172 may be determined based at least in part on the change in elevation along channel 168. For example, the number and/or size of barriers 172 may be increased as the change in elevation is increased such that the flow rate remains at a desired level.

Barriers 172 facilitate the control of the flow of feedstock material 116 to crucible 130. Barriers 172 allow the flow of feedstock material 116 to be maintained at a speed which inhibits surface disturbances of melt 110, e.g., splashes. In addition, barriers 172 reduce the wearing of crucible 130 due to the flow of feedstock material 116 into crucible 130. Moreover, barriers 172 reduce the generation of powder and dust in the crystal pulling system 100.

Channel structure 166 is connected to housing 162 by connection mechanism 174. Connection mechanism 174 includes any components suitable to connect channel 168 to housing 162 such that channel 168 and conduit 120 are in flow communication. For example, in the illustrated embodiment, connection mechanism 174 includes a bellows 176, a fixed flange 178, and a fast connecting flange 180. Accordingly, connection mechanism 174 facilitates movement between channel 168 and housing 162. Moreover, connection mechanism 174 enables quick connection and disconnection of channel 168 and housing 162. Channel structure 166 further includes an access flange 182, which facilitates maintenance and inspection of channel 168. In addition, access flange 182 provides for expansions of feed system 112.

Feed system 112 further includes a separation valve 122 that facilitates isolating feed system 112 from growth chamber 104 to allow feed system 112 to be refilled with feedstock material 116. Separation valve 122 is connected to channel structure 166 such that separation valve 122 and channel 168 are in flow communication. Separation valve 122 is also connected to upper dome 127 of housing 102 and in flow communication with growth chamber 104. Separation valve 122 is positionable between an open position where feedstock material 116 is allowed to flow through separation valve 122 and a closed position where feedstock material 116 is inhibited from flowing through separation valve 122. In some embodiments, separation valve 122 is positionable in a plurality of intermediate positions to facilitate control of the rate of flow through separation valve 122. Separation valve 122 may be any valve suitable to control the flow of feedstock material 116. For example, in some embodiments, separation valve 122 may be any of the following valves, without limitation: a gate valve system and a ball valve system. Suitably, separation valve 122 is actuated by an actuator 183, which may be automatic. In some embodiments, feed system 112 is configured to inhibit feedstock material 116 falling directly onto separation valve 122 to reduce the risk of separation valve 122 malfunctioning and/or leaking. In further embodiments, separation valve 122 is configured to resist malfunctioning and/or leaking due to particles in separation valve 122.

A rotation flange 184 connects separation valve 122 and channel structure 166 and is configured to enable rotation of feed system 112 relative to housing 102. In particular, channel structure 166 of feed system 112 rotates about rotation flange 184. Channel structure 166 may be disconnected from other portions of feed system 112 such as housing 162 and rotated to allow access to system 100 without dismounting feed system 112 from system 100. Rotating feed system 112 may allow access to housing 102 for cleaning crystal pulling system 100 without dismounting feed system 112. In addition, crystal pulling system 100 may be recharged during a running batch without dismounting feed system 112. In some embodiments, portions of feed system 112 such as container 114 and transport mechanism 118 remain stationary as portions of feed system 112 are moved. Feed system 112 may rotate any amount relative to puller 113. Suitably, feed system 112 can rotate at least 90° relative to puller 113.

During cleaning and maintenance of crystal pulling system 100, housing 102 of crystal pulling system 100 may be opened to clean crucible 130 or other components of crystal pulling system 100. Rotating a portion of feed system 112 facilitates housing 102 being opened. For example, in the illustrated embodiment, at least a portion of upper dome 127 is opened to facilitate cleaning crystal pulling system 100. Channel structure 166 is connected to upper dome 127 and moves with upper dome 127 as upper dome 127 is positioned between opened and closed positions. Channel structure 166 may be rotated and disconnected from portions of feed system 112 to enable upper dome 127 to be opened and closed. As a result, portions of feed system 112 may remain aligned in relation to growth chamber 104 when housing 102 is opened for cleaning and maintenance.

A doping mechanism 188 is connected to feed system 112 and allows for precise handling of a dopant that is provided to crucible 130. Any suitable doping mechanism 188 may be used. For example, PCT Patent Publication No. WO 2014/195980, which is incorporated by reference in its entirety, describes a suitable doping mechanism. By synchronizing doping mechanism 188 and feed system 112, a desired flow of dopant and silicon particles can be provided to melt 110 within crucible assembly 108. Accordingly, manual intervention during operation of system 100 can be minimized. As a result, risk of contamination and harm to operators can be reduced.

Channel structure 166 has separate branches that form a Y-shape. The separate branches are connected to conduit 120, doping mechanism 188, and puller 113. Feedstock material 116, which in some embodiments includes the dopant and silicon particles, is provided to crucible 130 via the lower branch and separation valve 122. A connection flange 186 is connected to separation valve 122 to enable connection of separation valve 122 to housing 102. Silicon particles and the dopant are introduced into channel 168 through separate upper branches and combined within channel 168. Doping mechanism 188 is positioned in relation to separation valve 122 such that dopant is introduced to feed system 112 upstream of separation valve 122 and flows substantially downward toward separation valve 122. For example, in the illustrated embodiment, doping mechanism 188 is above and approximately vertically aligned with separation valve 122 such that the dopant flows directly downward. As a result, crystal pulling system 100 has a configuration that allows doping mechanism 188 to provide a relatively large quantity of dopant throughout operation of crystal pulling system 100. After traveling through channel 168, feedstock material 116 is provided to crucible 130.

In some embodiments, a crystal pulling system includes a feed system mounted to a housing. The feed system is configured to be movable in relation to the housing such that maintenance of the crystal pulling system can be performed without dismounting the feed system. The feed system is configured to reduce dust and powder flowing through the crystal pulling system. For example, some embodiments include an outlet extension configured such that a layer of feed material collects adjacent the outlet extension. In addition, the feed system provides improved control of the flow of material delivered to the crucible. Moreover, the crystal pulling system is configured to require less maintenance than known systems and provide increased automation of the growing process.

The crystal pulling systems and methods described above achieve superior results compared to some known systems and methods. The crystal pulling systems reduce the risk of material contamination. As a result, the impurity accumulation in the silicon melt deriving from contamination in the systems is reduced. The systems also provide improved control of material flow through the systems. Moreover, the systems have reduced abrasion and wearing. Accordingly, the lifecycle of the system is increased and generation of powder and dust during operation is reduced. The system has improved operating efficiency which increases overall production and reduces operating costs. Moreover, the safety risks to operators during operation and maintenance of the systems is reduced.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for growing silicon crystal structures comprising:
   a housing including an upper dome and defining a growth chamber;
   a feed system attached to the upper dome for delivering silicon particles to the growth chamber, the feed system comprising:
      a support mechanism for supporting the feed system;
      a container for holding the silicon particles, the container including an outlet for discharging the silicon particles, wherein the container is maintained in a fixed positioned relative to the housing by the support mechanism;
      a channel connected to the outlet such that a flow of silicon particles discharged from the container flow through the channel;
      barriers disposed in the channel to slow the flow of the silicon particles through the channel, wherein the barriers extend from a bottom of the channel in a direction perpendicular to a direction of flow of the silicon particles within the channel;
      a connection flange directly connect to the housing;
      a separation valve directly connected to the connection flange, the separation valve movable between an open position allowing the silicon particles to flow through the separation valve and a closed position preventing silicon particles from flowing through the separation valve; and
      a rotation flange directly connected to the separation valve and the channel, wherein the channel rotates about the rotation flange, and wherein the channel is disconnected from the outlet when the channel rotates about the rotation flange to facilitate maintaining the system;
      and wherein at least a portion of the upper dome is positioned between an opened position and a closed position to facilitate cleaning the system, and the channel moves with the upper dome as the upper dome is positioned between the opened position and the closed position, and wherein the container remains stationary in relation to the housing as the upper dome and the channel are positioned between the opened position and the closed position.

2. The system of claim 1, wherein the support mechanism comprises a mount for fixedly mounting the feed system to the housing.

3. The system of claim 1, wherein the container remains substantially stationary in relation to the housing as the channel is rotated.

4. The system of claim 1, further comprising a feed system housing including an access panel.

5. The system of claim 1 further comprising an actuator configured to actuate the separation valve.

* * * * *